United States Patent [19]
Fossum et al.

[11] Patent Number: 6,137,100
[45] Date of Patent: Oct. 24, 2000

[54] CMOS IMAGE SENSOR WITH DIFFERENT PIXEL SIZES FOR DIFFERENT COLORS

[75] Inventors: Eric R. Fossum, La Crescenta; Michael Kaplinsky, Monrovia, both of Calif.

[73] Assignee: Photobit Corporation, Pasadena, Calif.

[21] Appl. No.: 09/093,968

[22] Filed: Jun. 8, 1998

[51] Int. Cl.[7] .............................. H01L 27/14; H04N 9/04
[52] U.S. Cl. ................ 250/208.1; 348/275; 348/276; 348/277; 348/280; 358/483; 257/440
[58] Field of Search .............. 250/208.1, 208.2, 250/226; 348/272, 273, 275, 276, 277, 280, 281, 282, 283, 300, 301, 308, 311, 315; 358/482, 483; 257/431, 432, 440

[56] References Cited

U.S. PATENT DOCUMENTS

| | | | |
|---|---|---|---|
| 4,264,921 | 4/1981 | Pennington et al. | 358/511 |
| 5,031,032 | 7/1991 | Perregaux et al. | 348/275 |
| 5,055,921 | 10/1991 | Usui | 348/272 |
| 5,119,181 | 6/1992 | Perregaux et al. | 348/275 |
| 5,406,066 | 4/1995 | Steinle et al. | 250/208.1 |
| 5,471,515 | 11/1995 | Fossum et al. | 377/60 |

*Primary Examiner*—John R. Lee
*Attorney, Agent, or Firm*—Fish & Richardson P.C.

[57] ABSTRACT

Active pixel sensor with separated pixel areas, each sensing a different primary color, red, green or blue. Each of the colors is sensed using a different size color filter element to allow receiving an amount of light dependent on the responses of the image sensor to the specific color.

12 Claims, 4 Drawing Sheets

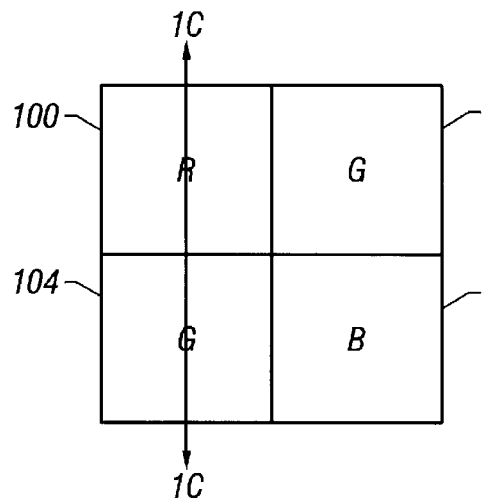
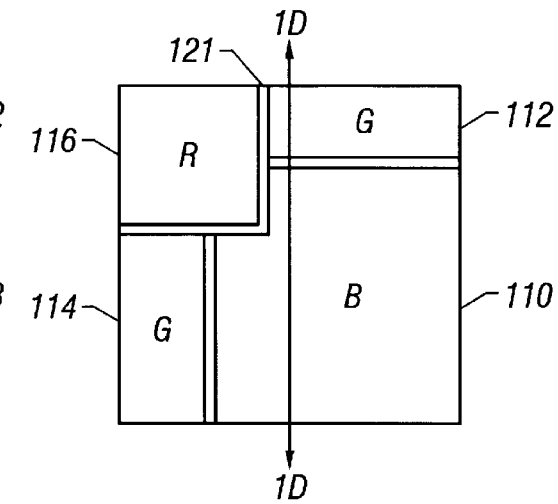
FIG. 1A
FIG. 1B
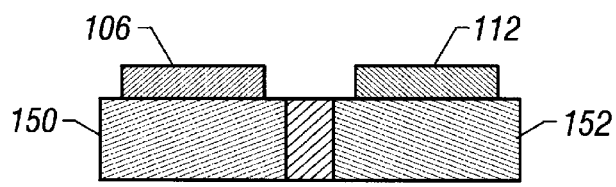
FIG. 1C
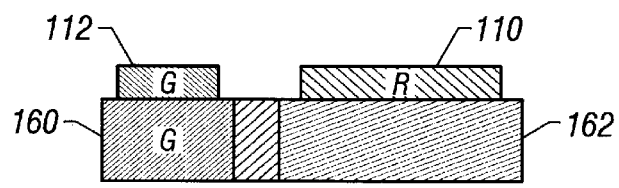
FIG. 1D

CMOS IMAGE SENSOR WITH DIFFERENT PIXEL SIZES FOR DIFFERENT COLORS

TECHNICAL FIELD

This invention relates to image sensors, and more particularly to complementary metal oxide semiconductor (CMOS) color image sensors.

BACKGROUND

A color image sensor is formed of a plurality of pixels. Each pixel receives energy from a different spectral band representing a different primary color. The most common arrangement is red (R), green (G), and blue (B) bands forming an "RGB" primary color system.

A crucial part of any such system is the signal to noise ratio. A noisy signal will have a poor look.

SUMMARY

An object of the system described according to the present disclosure is to improve the signal to noise ratio of the image signal.

A first aspect changes sizes of the pixel areas receiving the primary colors in a way that tends to equalize the amount of each color that is received. This is preferably done in an active pixel sensor system, with either a photodiode or photogate receiving incoming photons, and an active device, e.g., a source follower, within each pixel.

A first embodiment changes sizes of both color filters and underlying collectors. A second embodiment changes sizes of only color filters, and mathematically estimates the color therefrom.

DESCRIPTION OF DRAWINGS

These and other aspects of the invention will now be described with reference to the attached drawings, in which:

FIGS. 1A and 1C are diagrams of color pixels in the prior art.

FIGS. 1B and 1D are diagrams of an adjusted size pixel of the preferred embodiment.

DETAILED DESCRIPTION

Figure 1E:
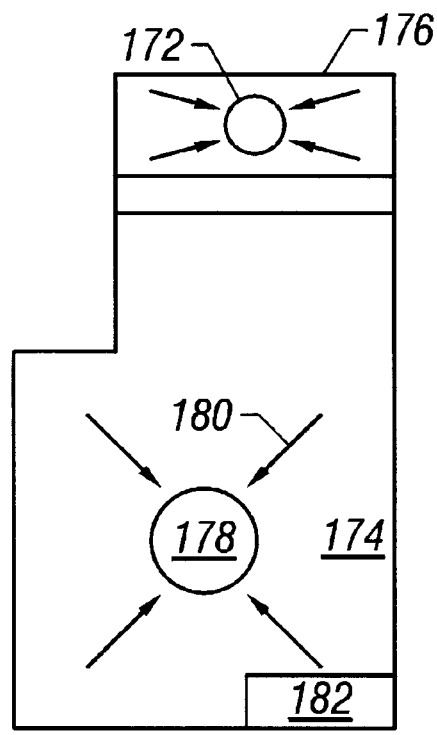
FIG. 1E shows a photodiode collector.

The inventors have noted that RGB type color sensors have varying responses to different colors. The ratio between signals from the red pixels (Vr), green pixels (Vg), and blue pixels (Vb) is typically in the rough ratio of 2.5 Vb:1.5 Vr:1.0 Vg. Thus, the blue pixels produce less output signal and typically require additional gain.

Gain can be used to boost the output signal. However, any such gain element would boost the noise along with the signal. The amplification circuit itself would also produces noise, e.g., Johnson noise produced by the components. Thus, the blue, which has the lowest sensitivity, would have the highest signal-to-noise ratio ("SNR").

In addition, this system could use separate gain elements for separate spectral band channels. These additional gains may not be convenient or cost-effective to implement.

The embodiment as described herein improves color image quality by improving the SNRs of colored pixels, and especially those pixel colors which conventionally produce less signal.

One embodiment changes the effective area of each color pixel, allowing the signal to be boosted through the collection of additional photons rather than by electronic gain. This is preferably done as part of a CMOS image sensor since doing this using a charge coupled device (CCD) image sensor might require changing charge transfer efficiency. A CMOS sensor with an integral buffer in each pixel and which outputs its signals via on chip circuitry is preferred.

The output voltage $V_n$ for each pixel is:

$$V_n \alpha \phi_n T_n A_n \eta_n G_n$$

where the flux per unit area of each pixel $\phi_n$, where n=1, 2, 3 ..., is the spectral band (e.g., 3 bands in the case of RGB), the transmission of each spectral band filter is $T_n$, the collection area of each pixel is $A_n$, the quantum efficiency of each pixel is $\eta_n$, and the conversion gain of each pixel is $G_n$.

In order to equalize the output voltage $V_n$ with the flux $\phi_n$, the pixel area $A_n$ and the conversion gain $G_n$ for the different bands are varied.

A first embodiment lays out colored pixels in an ensemble macro pixel in which the sizes of the different spectral band portions are different. The pixel array of the imager is covered by colored optical filters arranged in a specific pattern. The minimum repeatable element of the color filter pattern is referred to as a macro pixel.

FIG. 1A depicts a color filter pattern known as a Bayer pattern. The Bayer pattern in FIG. 1 has equal areas for all colored pixels arranged as shown with two green pixels, a red pixel, and a blue pixel. Each of the collection areas is the same size. For reasons related to the sensitivity of the human eye, there are extra green pixels, providing extra green resolution and sensitivity.

FIG. 1B shows the preferred adjustment of the sizes of the collection areas according to this embodiment. The schematic illustration in FIG. 1B shows a largest size collection area 110 for the blue collection, the lowest efficiency color element. The red collection area 116 is smaller than the blue. The smallest size collection elements 112, 114 are provided for the most efficient collection element, here green.

A cross section of the circuit of FIG. 1A, along the line 1C—1C, is shown in FIG. 1C. This shows two photodiode type collecting pixels, 150 and 152. Pixel 150 is covered by blue filter 100, allowing only blue light to pass. Pixel 152 is covered by red filter 112, allowing only red light to pass. The sizes of the filters 110 and 112 are substantially the same as is the sizes of the underlying collection areas 150, 152.

FIG. 1B shows the preferred embodiment with different sized color filters for each color. FIG. 1D shows a cross section across the line 1D—1D in FIG. 1B. FIG. 1D shows that the green color filter 112 is smaller in size than the blue color filter 110. Similarly, the underlying collection area 160 which underlies the green filter and hence collects the green light which passes through the green filter is similarly smaller than the size of the blue collection area 162.

It is also possible to adjust the green pixels so that more equal modulation transfer function can be achieved horizontally and vertically for the green pixels.

This approach to improving lower efficiency response, e.g. blue or green, could be very difficult to implement in a CCD. Changing the CCD channel width could result in poor charge transfer efficiency. An X-Y addressable sensor, such as a CMOS active pixel sensor of the type described in U.S.

Pat. No. 5,471,515, or a passive pixel sensor allows using this approach. More specifically, each pixel element includes associated circuitry therein shown as 182 in FIG. 1E. This circuit can be anything which takes some operation on the output signal prior to its output. A usual circuit is a source-follower formed of a logic family that is compatible with CMOS, e.g., CMOS or NMOS.

X-Y addressable imagers allow independent readout of adjacent pixels. On the other hand, CCD imagers employ so-called vertical (horizontal) transfer registers with all charges accumulated in the pixels of one column (row) readout through the same register by repeated clocking of charges towards output circuitry. Variations in pixel sizes of CCD imagers would imply the variations in transfer channel width along the transfer register, since the registers must be positioned in the immediate proximity of the detectors. The variations in the channel width of CCD transfer register would therefore, likely lead to "bottlenecks", regions where a direction of fringe electrical fields is not aligned with the direction of charge transfer. This, in turn, would result in reduced charge transfer efficiency.

In a photodiode-type active pixel, increasing the area of the photodiode may result in a concomitant decrease in conversion gain $G_n$ and hence so that the $V_n$ may not be increased. This is described in our copending application Ser. No. 08/944,794, filed Oct. 6, 1997. In the photodiode-type active pixel, the photoelectrons are accumulated on the capacitance formed by the depletion area of the photodiode. Increasing the area of the photodiode increases the amount of incident photons and hence the amount of generated photoelectrons. However, the increase in photodiode size also results in higher capacitance of the depletion region due to its higher volume. Therefore, the increase in the size of photodiode may only minimally increase the conversion gain since the voltage across the photodiode is directly proportional to accumulated charge and inversely proportional to the depletion layer capacitance.

However, it is possible to increase the photosensitive area of the pixel without corresponding increase in the size of the doped photodiode region. An exemplary pair of pixels is shown in FIG. 1E. Note that the pixel 172 is much smaller than the pixel 174. However, the photodiode collector 176 is only a very small part of the pixel area 172. Similarly, the photodiode collector 178 is only a very small part of the pixel area 174. However, incoming photons also land within the substrate area, and travel to the photodiode collector 178. The traveling of those incoming photons is shown by arrows by 180. Hence, it is believed that the collection efficiency will still be proportional to the size of the collection area even if the actual collector element (here the photodiodes) is much smaller than the overall collection area.

This will result in increased collection of photons without increase in diode capacitance leading to the net increase in the detected signal. In the latter case, the photoelectrons generated under the open area would have to diffuse toward the diode to be collected. This process is known as lateral collection. Therefore, one way to achieve the results of the present system for equalization of the signals corresponding to pixels of different colors is to make the photosensitive area of the photodiode-type pixel larger than the area corresponding to the diode itself.

Hence, the photodiode area can be used to vary $G_n$ and an open area (no diode) used with lateral collection to increase the effective value of $A_n$.

FIG. 1D shows reverse-biased diodes such as 121 being used to separate each region. This prevents or minimizes charge spill-over.

Alternatively, the photodiode can be used in conjunction with a transfer gate to decouple the area of the diode from the conversion gain. This can result in lag if a flood and spill operation is not used. This is illustrated in FIGS. 2 and 3.

The photogate area of a photogate type active pixel can be increased independently of the floating diffusion node. This decouples the area A from the gain G. The increase in the area of the photodiode can lead to increased sensitivity of the pixel, provided that the signal is read out from the capacitance other than the capacitance of the depletion layer of the photodiode.

Figure 2:
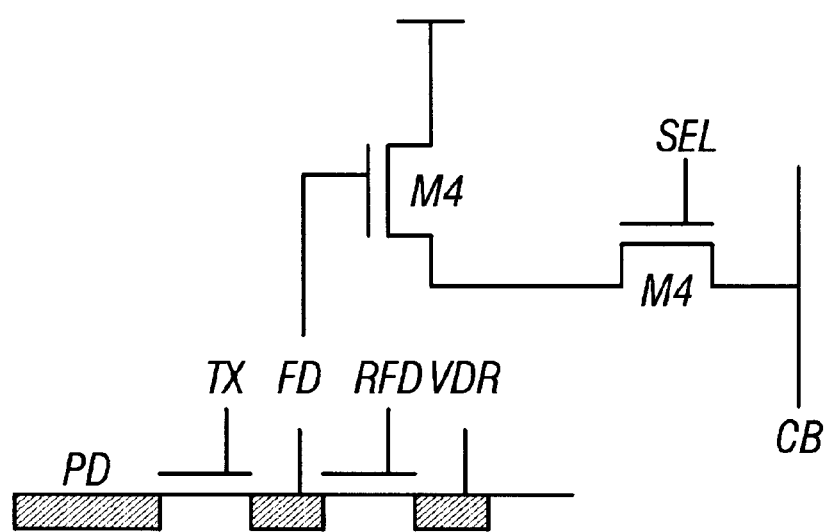
FIG. 2 is a diagram of photodiode-type pixel in accordance with a preferred embodiment of the invention.
Figure 3:
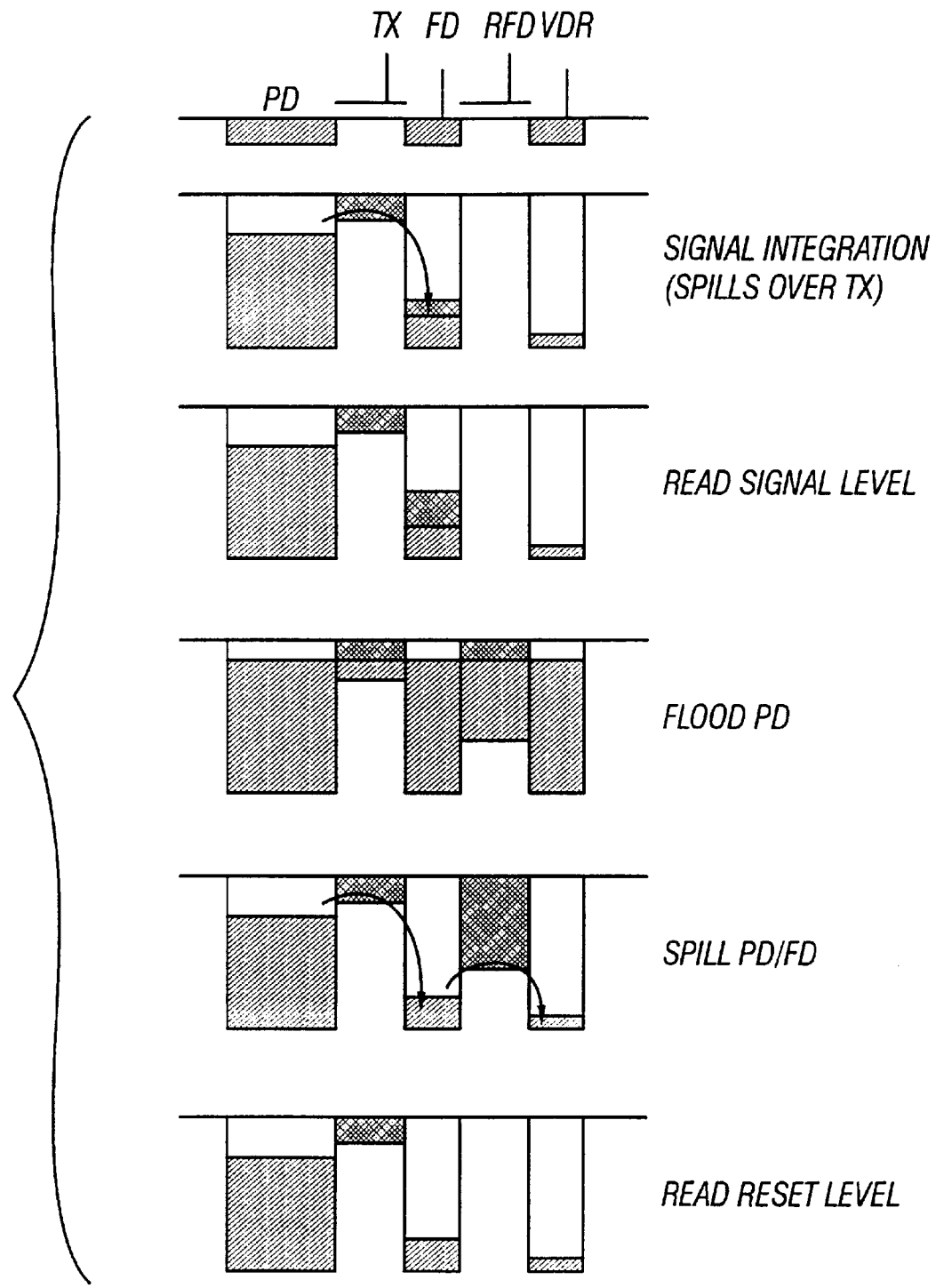
FIG. 3 is a diagram of photodiode-type pixel operation in accordance with the invention.

One way to decouple the area of photodiode from the capacitance used for readout is to employ a floating diffusion separated from the photodiode by the transfer gate as illustrated in FIG. 2. As shown in FIG. 3, the integrated charge spills from photodiode into floating diffusion over the transfer gate. Following integration, the signal accumulated on the floating diffusion is read out. The conversion gain is therefore independent of the size of the photodiode. The process of charge transfer from photodiode into floating diffusion may not reach equilibrium during the integration time, resulting in residual charge being added to the charge generated during the next integration period. This effect is known as lag.

To avoid lag, the photodiode and floating diffusion are brought to the reset potential at the end of the signal readout by a so-called flood-and-spill operation. Upon completion of the readout, the RFD gate is biased high and the VDR gate is pulsed low. This floods the photodiode and floating diffusion with charge. VDR is then pulsed high which drains excess charge from the photodiode and floating diffusion bringing them to the reset level. RFD is then brought to its quiescent level.

Figure 4A:
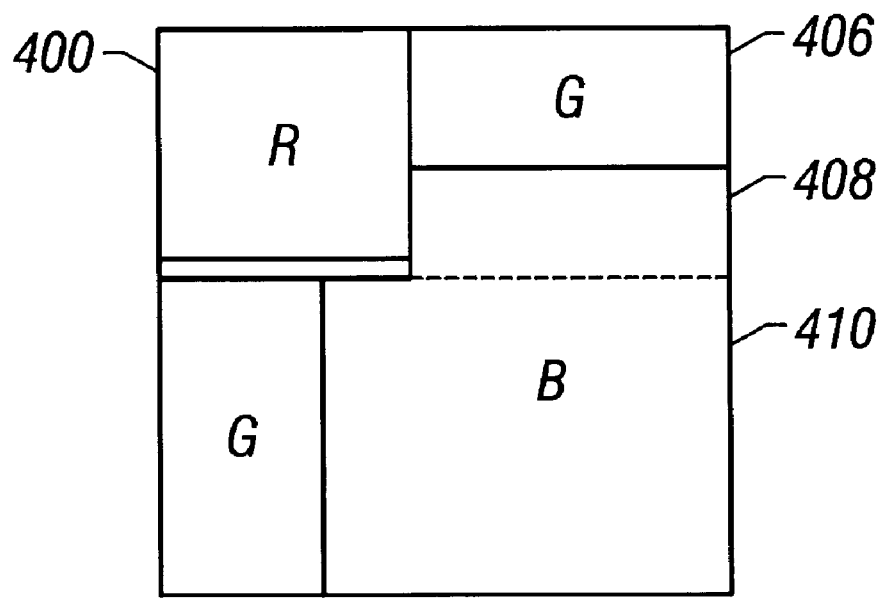
FIGS. 4A and 4B are diagrams of a second embodiment in which the sizes of color filters are changed, but sizes of collectors are not changed.
Figure 4B:
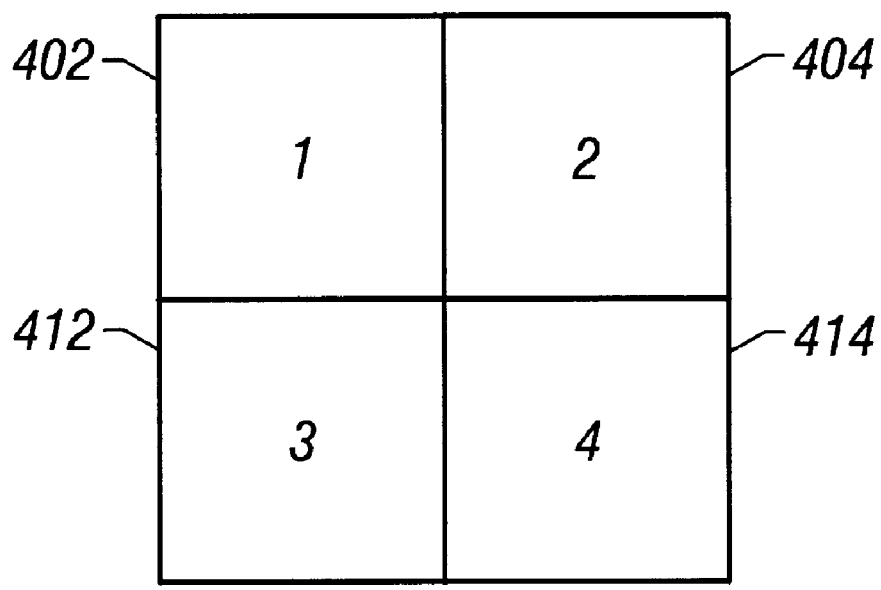

Another aspect of this concept uses a sensor where each pixel is covered with a proportion of different spectral band filters. This is shown in FIGS. 4A and 4B. FIG. 4A shows the color filters which are used with the photodiode pixels of FIG. 4B. Note that the light-receiving elements or FIG. 4B are substantially equal in area, while the color filters of FIG. 4A are not equal in area. The system of this embodiment allows increasing the signal to noise ratio without changing the relative size of the light-receiving elements.

In order to use the system, some interpolation of the results must be obtained. The red filter 400 allows only photons with the red color to pass therethrough, and hence pixel 1, element 402, represents the red light incident on pixel 1. However, we really want to know the values of all of red, blue and green incident on pixel 1.

For pixel 2, collector 404, the incident is two-thirds green from green filter 406 and one-third blue from portion 408 of blue filter 410. Similarly, pixel 3, receiver 412, receives two-thirds green and one-third blue.

Pixel 4, receiver 414, receives all blue. From this, we can establish the following equations:

$$P_1 = R$$

$$P_2 = 0.6G + 0.3B \quad \text{(Equation 1)}$$

$$P_3 = 0.6G + 0.3B$$

$$P_4 = B$$

This is formed into a matrix of the following form:

$$\begin{bmatrix} R \\ G \\ B \end{bmatrix} = \begin{bmatrix} R_{11} & R_{12} & R_{13} \\ G_{21} & G_{22} & \cdots \\ & & \end{bmatrix} \begin{bmatrix} R \\ G \\ B \end{bmatrix}$$

and solved to obtain red, green and blue information at all of the four pixels 1 through 4. Many of these features are well known and used in the reconstruction of a standard color correction matrix.

FIG. 4 shows four color filter elements 400, 402, 404 and 406 with their effective apertures. The filters associated with the pixels are also illustrated. In the illustrated case, the nominally green pixels are partially covered with a blue filter to increase the blue response. Thus, the signal incident on the green pixel 400 is approximately ⅔ green and ⅓ blue. Of the ensemble of 4 pixels, approximately 5/12 of the area is sensitive to blue photons, 3/12 to red photons, and 4/12 to green photons. Reconstruction of RGB for each pixel is accomplished by a standard color correction matrix, with more emphasis on off-diagonal elements.

This is different from a yellow filter which represents a 1:1 mix of green and blue photons—a ratio that cannot be varied by layout. Furthermore, the modulation transfer function of the arrangement is different than that obtained from a complementary filter pattern and may represent an advantage in some applications. The concept of modulation transfer function (MTF) is used as a measure of the spatial resolution of the imaging system. More precisely, MTF is defined as the response of the imaging system to the input signal with a sinusoidal change in spatial frequency. The input signal incident on the imager is "sampled" by the pixels of the finite width and pitch with the input signal being averaged across the area of the pixel. Therefore, the resolution of the imager, and hence its MTF, strongly depends on the pixel pitch and size.

The macro pixel arrangement depicted in FIG. 1B has two green pixels with their total width equal to their total length and equal pixel pitch in both vertical and horizontal directions. Therefore, the layout shown in FIG. 1B results in equalization of the imager response to red, green, and blue illumination while preserving the MTF equality in vertical and horizontal directions. Note that the macro pixel shown in FIG. 1A is also characterized by equality of vertical and horizontal MTF but suffers from sharply different response to red, green, and blue bands as explained in the other parts of this disclosure.

A number of embodiments of the present invention have been described. Nevertheless, it will be understood that various modifications may be made without departing from the spirit and scope of the invention.

What is claimed is:

1. A color pixel assembly, comprising:
a plurality of macro pixels, each macro pixel comprising:
a plurality of individually-addressable pixel elements, each pixel element receiving light, and producing an output signal indicative of an amount of light received, and including a first pixel element with a first color filter of a specified size, representing a first primary color, a second color filter of a second specified size, smaller than said first specified size, and representing a second primary color, and a third filter of a third specified size, representing a third primary color, wherein said third specified size is smaller than said first and second specified sizes, wherein said primary colors are blue, green and red, respectively.

2. An assembly as in claim 1, wherein said pixel elements include a light collecting area underlying each said color filter, each light collecting area being substantially the same size as said color filter which it underlies.

3. A color pixel assembly, comprising:
a plurality of macro pixels, each macro pixel comprising:
a plurality of individually-addressable pixel elements, each pixel element receiving light, and producing an output signal indicative of an amount of light received, and including a first pixel element with a first color filter of a specified size, representing a first primary color, a second color filter of a second specified size, smaller than said first specified size, and representing a second primary color, and a third filter of a third specified size, representing a third primary color, wherein said pixel elements include light collecting areas underlying said color filters, each of said light collecting areas being substantially the same size, and at least one of said light collecting areas being a different size than an overlying color filter, and said overlying color filter overlies at least two of said light collecting areas.

4. An assembly as in claim 3, wherein said pixel elements include photodiode light collecting areas underlying said color filters.

5. An assembly as in claim 3, wherein said pixel elements include photogate light collecting areas underlying said color filters.

6. An assembly as in claim 3, further comprising a reverse based diode separating two adjacent pixels.

7. An active color pixel assembly, comprising:
a plurality of macro pixels, each macro pixel comprising:
a plurality of individually-addressable pixel elements, each pixel element having a light collecting area receiving incoming light, and producing an output signal indicative of an amount of light received, each pixel element including associated circuitry therein which processes said output signal prior to its output, said associated circuitry being formed of a logic family that is compatible with CMOS, said pixels including a first pixel element with a first color filter of a specified size, representing a first primary color, a second color filter of a second specified size, smaller than said first specified size, and representing a second primary color, wherein said light collecting area of said first pixel element has a less efficient response to said second primary color than to said first primary color, and a third filter of a third specified size, representing a third primary color, wherein said third specified size is smaller than said first and second specified sizes, and wherein said primary colors are red, green and blue, respectively.

8. An assembly as in claim 11 wherein each light collecting area is substantially the same as an associated said color filter.

9. An active color pixel assembly, comprising:
a plurality of macro pixels, each macro pixel comprising:
a plurality of individually-addressable pixel elements, each pixel element having a light collecting area receiving incoming light, and producing and output signal indicative of an amount of light received, each pixel element including associated circuitry therein which processes said output signal prior to its output, said associated circuitry being formed of a logic family that is compatible with CMOS, said pixels including a first pixel element with a first color filter of a specified size, representing a first primary color, a second color filter of a second specified size, smaller than said first specified size, and representing a second primary color, wherein said light collecting area of said first pixel element has a less efficient response to said second primary color than to said first primary color, and a third filter of a third specified size, representing a third primary color, wherein each of said light collecting areas is substantially the same size, and at least one of said light collecting areas being a different size than an overlying color filter and said overlying color filter overlies at least two of said light collecting areas.

10. An assembly as in claim 9, wherein said pixel elements include photodiode light collecting areas underlying said color filters.

11. An assembly as in claim 9, wherein said pixel elements include photogate light collecting areas underlying said color filters.

12. An assembly as in claim 9, further comprising a reverse biased diode separating two adjacent pixels.

* * * * *

UNITED STATES PATENT AND TRADEMARK OFFICE
CERTIFICATE OF CORRECTION

PATENT NO.   : 6,137,100
DATED        : October 24, 2000
INVENTOR(S)  : Eric R. Fossum and Michael Kaplinsky It is certified that error appears in the above-identified patent and that said Letters Patent is hereby corrected as shown below:

<u>Column 6,</u>
Line 54, please replace "claim 11" with -- claim 7 --.
Line 61, please replace "and output" with -- an output --.

Signed and Sealed this

Twenty-third Day of April, 2002

Attest:

Attesting Officer

JAMES E. ROGAN
*Director of the United States Patent and Trademark Office*